United States Patent
Goodner et al.

(10) Patent No.: US 6,991,893 B2
(45) Date of Patent: *Jan. 31, 2006

(54) CONTROLLING RESIST PROFILES THROUGH SUBSTRATE MODIFICATION

(75) Inventors: Michael D. Goodner, Hillsboro, OR (US); Robert P. Meagley, Aloha, OR (US); Michael J. Leeson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 270 days.

This patent is subject to a terminal disclaimer.

(21) Appl. No.: 10/284,662

(22) Filed: Oct. 31, 2002

(65) Prior Publication Data

US 2004/0086809 A1    May 6, 2004

(51) Int. Cl.
*G03F 7/00* (2006.01)

(52) U.S. Cl. ...................... 430/322; 430/313; 430/327

(58) Field of Classification Search ................ 430/322, 430/313, 327, 270.1, 271.1
See application file for complete search history.

(56) References Cited

U.S. PATENT DOCUMENTS

| | | | | |
|---|---|---|---|---|
| 5,108,875 A | * | 4/1992 | Thackeray et al. | 430/326 |
| 5,281,690 A | * | 1/1994 | Flaim et al. | 528/353 |
| 5,316,891 A | * | 5/1994 | Hashimoto et al. | 430/296 |
| 5,578,676 A | * | 11/1996 | Flaim et al. | 524/609 |
| 5,976,769 A | * | 11/1999 | Chapman | 430/316 |
| 6,261,743 B1 | * | 7/2001 | Pavelchek et al. | 430/325 |
| 6,767,689 B2 | * | 7/2004 | Pavelchek et al. | 430/271.1 |

* cited by examiner

*Primary Examiner*—John L Goodrow
(74) *Attorney, Agent, or Firm*—Trop, Pruner & Hu, P.C.

(57) ABSTRACT

Photoresists may be formed over a structure that has been modified so as to poison a lower layer of the photoresist. Then, when the photoresist is patterned, it is only patterned down to the poisoned layer. The poisoned layer may be removed subsequently. However, because of the use of the modification process, the critical dimensions of the photoresist may be improved in some embodiments.

22 Claims, 2 Drawing Sheets

CONTROLLING RESIST PROFILES THROUGH SUBSTRATE MODIFICATION

BACKGROUND

This invention relates generally to fabricating integrated circuits and, particularly, to techniques for using photoresist to pattern features on semiconductor structures.

A photoresist may be formed over a semiconductor structure. The photoresist may be selectively exposed to radiation. Regions of the photoresist that are exposed to radiation may be more or less susceptible to attack by subsequent etching processes. Thus, by exposing a pattern on the photoresist, the photoresist may be patterned to have a particular profile. This profile may then act as a mask for subsequent processes to remove underlying material, for example, in the desired pattern.

In photoresist patterning techniques for forming relatively small features, it is desirable to control the photoresist profile to prevent undercutting of a developer sensitive substrate. A substrate is any material that is positioned under the photoresist and can include antireflective coatings and resist release layers. A resist release layer is a layer that is utilized to facilitate the release of the resist after the patterning is completed. In particular, it may be desirable to control resist profiles to enhance pattern fidelity at the bottom of printed features, such as trenches and holes.

One technique for using photoresist is called the Shipley lift-off layer (LOL). The LOL facilitates removal of the photoresist after patterning and etching and is one type of resist release layer. The LOL is easily attacked by the photoresist developer. The photoresist developer is utilized to develop the material after exposure. Since the LOL is easily attacked by that developer, lifting or peeling of the photoresist may occur prior to etching.

However, intentionally underdeveloping the photoresist leaves a thin layer of photoresist over the LOL, preventing the developer from attacking the LOL. This may be followed by a descum step to break through the remaining resist and LOL. This process may be followed by standard etching of the underlying substrate. While this procedure has promise, it is difficult to control and has relatively little process margin.

Thus, there is a need for better ways to control photoresist profiles.

DETAILED DESCRIPTION

Figure 1:
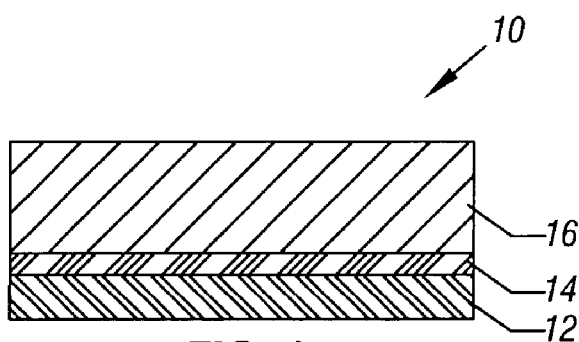
FIG. 1 is an enlarged cross-sectional view in an early stage of fabrication.

Referring to FIG. 1, a substrate 12 may be covered with an anti-reflective coating or a resist release layer 14, such as a lift-off layer (LOL) in one embodiment of the present invention. A photoresist 16 may then be formed over the layer 14, for example, by spin coating. The acid/base properties of the substrate 12 and/or layer 14 may be modified to control the profile of the photoresist 16 in the vicinity of the resist/substrate interface.

In some embodiments the layer 14 may be used due to processing constraints such as chemical attack, normal resist strip temperatures, or because dry etch may cause damage to polymeric, metallic, organic, or inorganic coatings on the wafer. Therefore, a resist release layer 14 may be utilized to facilitate removal of the photoresist 16 after patterning. In one embodiment, a Shipley lift-off layer, such as LOL-2000, available from Shipley Company, Marlborough, Mass., may be utilized. In other embodiments the resist release layer 14 may not be used.

An acid, a base, an acid analog, or a base analog may be added to a structure, such as the resist release layer 14 or the substrate 12, to modify the resist 16 in the vicinity of the resist 16 structure interface. A base analog is a substance which, when exposed to certain ambient characteristics, forms a base. Examples of such ambient characteristics include photo exposure or thermal exposure. Similarly, an acid analog is a substance that forms an acid when exposed to certain ambient characteristics such as a thermal condition or a photo exposure.

If a base or base analog is added to the resist release layer 14, resist 16 poisoning may result in a lack of resist development in the poisoned area of the resist 16. Therefore, in some embodiments, standard processing conditions can be used to pattern the photoresist 16, providing good critical dimension control and controllable critical dimension bias while maintaining a protective layer of photoresist 16 to prevent premature dissolution of the resist release layer 14.

Figure 2:
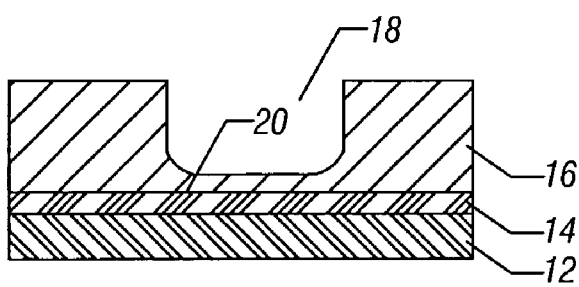
FIG. 2 is an enlarged cross-sectional view at a subsequent stage of fabrication in accordance with one embodiment of the present invention.

As shown in FIG. 2, the photoresist 16 may be exposed and developed using standard processes to form a trench 18. The trench 18 stops at the poisoned region 20 of the photoresist 16. However, the rest of the trench 18 profile may be relatively vertical, indicating that good critical dimension control may be maintained throughout the remainder of the process.

Figure 3:
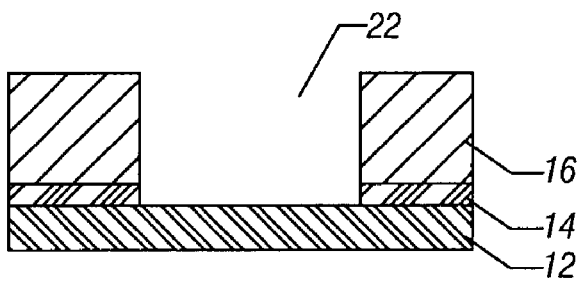
FIG. 3 is an enlarged cross-sectional view at a subsequent stage of manufacture in accordance with one embodiment of the present invention.
Figure 4:
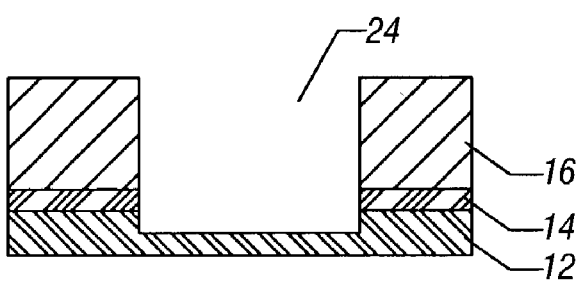
FIG. 4 is an enlarged cross-sectional view at a subsequent stage of manufacture in accordance with one embodiment of the present invention.

Next, referring to FIG. 3, a descum process may clear the photoresist 16 and resist release layer 14 from the bottom of the trench 22. Thereafter, the substrate 12 may be etched, as indicated in FIG. 4.

Exposure dependent poisoning of the photoresist 16 may be accomplished through the application of a photo-acid generator (PAG) or a photo-base generator (PBG).

Photo-acid generators are commonly added to photoresist to catalyze decomposition upon exposure to radiation. Thus, the addition of a photo-base generator to a portion of the resist 16 that relies on a photo-acid generator for decomposition may reduce the decomposition rate of that portion effecting a modulation of the resist's contrast curve. Examples of suitable photo-acid generators include onium salts, sulfides, nitroaryl derivatives or aryl sulfates (for example, or tosylates). Photo-acid generators may include sulfide and onium type compounds such as diphenyl iodide hexafluorophosphate, diphenyl iodide hexafluoroarsenate, diphenyl iodide hexafluoroantimonate, diphenyl p-methoxyphenyl triflate, diphenyl p-tert-butylphenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, triphenylsulfonium nonafluorobutylsulfonate, diphenyliodonium heptadecafluorooctylsulphonate, and dibutylnaphthysulfonium triflate.

Examples of photo-base generators may include nitrocarbamate, quaternary ammonium dithiocarbamate, other generators listed, for example, in Prog. Polym.-Sci., volume 21, 1–45 (1996 Elsevier Science, Ltd.) and a polymeric photobase generator containing oxime-urethane groups described in Chae, Kyo Ho et al. "Image recording material based on the polymeric photobase generator containing oxime-urethane groups," Macromol. Rapid Commun. 200, 21, 1007–1012. Photo-acid generators are commands added to photoresist to catalyze decomposition upon radiation exposure. Thus, the addition of a photo-base generator to a portion of a resist that relies on a photoacid generator to enable decomposition may disable decomposition in the affected portion of the resist.

Examples of thermal base generators include o-{(.beta.-(dimethylamino)ethyl)aminocarbonyl}benzoic acid, o-{(.gamma.-(dimethylamino)propyl)aminocarbonyl}benzoic acid, 2,5-bis{(.beta.-(dimethylamino)ethyl)aminocarbonyl} terephthalic acid, 2,5-bis{(.gamma.-(dimethylamino)propyl) aminocarbonyl}terephthalic acid, 2,4-bis{(.beta.-(dimethylamino)ethyl)aminocarbonyl}isophthalic acid, and 2,4-bis{(.gamma.-(dimethylamino)propyl) aminocarbonyl} isophthalic acid. The synthesis of these thermal base generators is described, for example, in U.S. Pat. No. 6,258,506.

General classes of bases commonly used in photolithography, also referred to as quenchers, may be used in lieu of using thermal or photo-base generators including pyrrolidinones, piperidines, trialkylamines, morpholines, pyridines, and anilines. Specific examples include N-methyl pyrrolidinone, 1-piperidineethanol, 1,8-diazabicyclo[5.4.0]undec-7-ene, trioctylamine, N-isobutylmorpholine, and N,N-dimethylaminopyridine. Additionally, polymeric derivatives of these classes of materials may also be used as quenchers, such as poly(pyrrole), polyaniline, poly(2-vinylpyridine), or poly(N-vinyl-2-pyrrolidone).

The amount of photo-acid generator, photo-base generator, thermal base generator, or thermal acid generator may be determined using empirical techniques or simulation to give the desired profile when used in conjunction with a specific photoresist in a specific processing method having specified processing times and temperatures. Concentrations for the additives may range from 0.01 to ten times the concentration of the PAG in the photoresist, with a more preferable concentration of 0.02 to two times the concentration of the PAG in some embodiments. In general, a proton donor may be used to neutralize the proximate proton acceptor based moieties in the adjacent layer of photoresist 16, and vice versa.

In accordance with one embodiment of the present invention, the release layer 14 and the photoresist 16 may be subjected to a bake at from 50 to 150° C. with the most advantageous processing temperatures between 80 and 130° C. The bake time for the release layer 14 and the photoresist 16 may be from 15 to 300 seconds, with the most advantageous times between 45 and 120 seconds.

The bake time and temperature may be sufficient to cause diffusions of acid or base, acid or base analog or generator into the photoresist 16 from the appropriate substrate, such as the release layer 14. These baking times and temperatures, in effect, allow the acid, base, analog, or generator to diffuse into the photoresist 16 where it can be effective in disabling the photoresist.

In the embodiments described above, generally a portion of the photoresist is poisoned from an underlying layer. This generally means that where the photoresist uses a photo-acid generator, for example, a photo-base generator is caused to diffuse into the photoresist from the underlying layer and vice versa. In general then, when acids are used to break down the photoresist, bases can be used that are also activated by the same mechanism to prevent the breakdown of the photoresist.

In other embodiments of the present invention, the underlying layer may supply, for example by diffusion, a similar active component to that used in the photoresist to initiate photoresist breakdown. As a result, the component which diffuses into the photoresist from the underlying layer may be utilized to reduce footing, scumming, and the like. Conversely, undercutting may be reduced by poisoning the photoresist layer from the underlying layer. Thus, in some embodiments it may be desirable to deactivate the component of the photoresist that is responsible for breaking down the photoresist and in other instances it may be desirable to enhance that activity.

Figure 5:
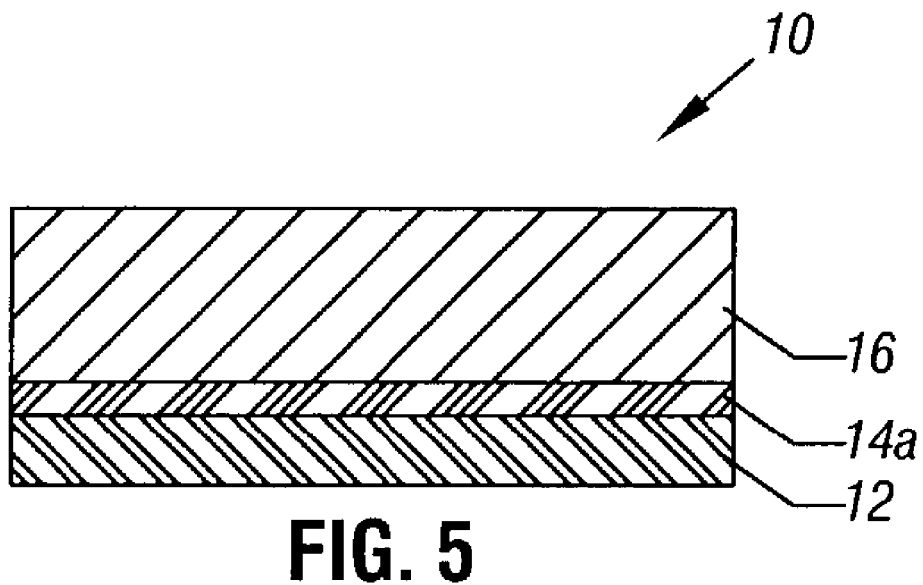
FIG. 5 is an enlarged cross-sectional view of another embodiment of the present invention.
Figure 6:
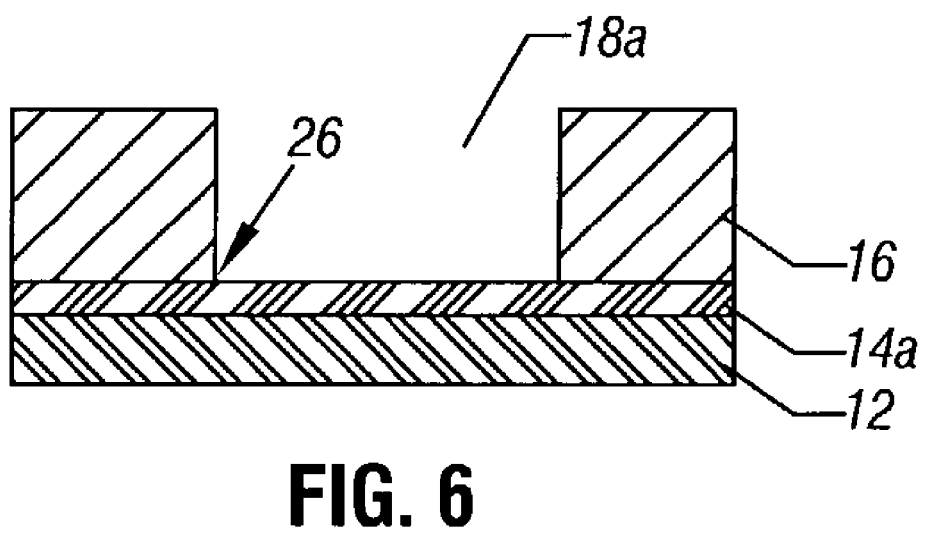
FIG. 6 is an enlarged cross-sectional view at a subsequent stage in accordance with one embodiment of the present invention.

As shown in FIG. 5, a photoresist 16 that uses a photo-acid generator to initiate breakdown of the photoresist may be supplied with additional photo-acid generator from an underlying layer 14a. Upon heating the photoresist, the photo-acid generator may diffuse from the layer 14a into the photoresist to enhance interfacial breakdown of the photoresist upon radiation exposure, for example, to reduce footing in the trench 18a at 26, as shown in FIG. 6.

Conversely, in a photoresist that uses a photo-base generator, a photo-base generator may diffuse in from an underlying layer to further enhance the breakdown of the photoresist, particularly at the photoresist/layer interface.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing a layer including a substance to interfere with the ability of an overlying photoresist to be altered by radiation exposure;
   covering said layer with photoresist; and
   baking said layer to cause said substance to enter the photoresist to prevent alteration, upon exposure to radiation, of a portion of an overlying photoresist.

2. The method of claim 1 including poisoning a region of the photoresist by modifying the substance so that the portion of the photoresist adjacent said substance is not subject to patterning.

3. The method of claim 1 including patterning the photoresist down to said portion.

4. The method of claim 1 wherein providing a substance to prevent includes providing a compound in said structure to generate an acid-base reaction with the photoresist.

5. The method of claim 4 including preventing the decomposition of the photoresist by neutralizing a material in said portion that enables the photoresist to be altered when exposed to radiation.

6. The method of claim 5 including preventing the decomposition of the photoresist in a layer proximate to said layer.

7. The method of claim 1 wherein providing a layer includes providing a liftoff layer.

8. The method of claim 1 wherein providing a layer includes providing a resist release layer.

9. The method of claim 1 including forming a trench through the photoresist down to said portion of the overlying photoresist using radiation exposure and subsequently removing said portion.

10. The method of claim 1 wherein, if the photoresist uses a photo-acid generator to alter the photoresist upon exposure, providing a photo-base generator in said layer.

11. The method of claim 1 wherein, if said structure uses a photoacid generator to alter the photoresist upon exposure, providing a photo-base generator in said layer.

12. The method of claim 1 wherein providing a layer includes providing a material in said structure that prevents the decomposition of an overlying portion of said photoresist.

13. The method of claim 12 including providing a proton donor that interferes with the action of a photo active proton acceptor to decompose the photoresist.

14. The method of claim 12 including providing a proton acceptor in said structure that interferes with the action of a proton donor in said photoresist to decompose the photoresist.

15. A method comprising:
   exposing a photoresist to radiation to alter said photoresist;
   providing a substance that is activateable in response to an ambient condition to prevent a portion of the photoresist from being altered upon exposure to radiation;
   providing a structure including said substance in proximity to said photoresist; and
   heating said substance to cause said substance to enter said photoresist.

16. The method of claim 15 wherein providing a substance includes providing a substance that is radiation activated.

17. The method of claim 15 including providing a substance that is thermally activated.

18. The method of claim 15 including providing said substance to neutralize a chemical in said photoresist that enables decomposition of said photoresist upon exposure to radiation.

19. A method comprising:
   exposing a photoresist to radiation to alter said photoresist;
   providing a substance that is activateable in response to an ambient condition to prevent a portion of the photoresist from being altered upon exposure to radiation;
   providing a structure including said substance in proximity to said photoresist; and
   heating said substance to cause said substance to enter said photoresist.

20. The method of claim 19 wherein providing a substance includes providing a substance that is radiation activated.

21. The method of claim 19 including providing a substance that is thermally activated.

22. The method of claim 19 including providing said substance to neutralize a chemical in said photoresist that enables decomposition of said photoresist upon exposure to radiation.

* * * * *